United States Patent
Kuo

(10) Patent No.: US 6,289,975 B2
(45) Date of Patent: Sep. 18, 2001

(54) HEAT DISSIPATING DEVICE

(76) Inventor: Ching-Sung Kuo, No.38, Lane 111, Nan-Tien-Mu Rd., Tu-Cheng City, Taipei Hsien (TW)

( * ) Notice: Subject to any disclaimer, the term of this patent is extended or adjusted under 35 U.S.C. 154(b) by 0 days.

(21) Appl. No.: 09/804,610

(22) Filed: Mar. 12, 2001

Related U.S. Application Data

(63) Continuation of application No. 09/379,069, filed on Aug. 23, 1999.

(51) Int. Cl.[7] .................................................. H05K 7/20
(52) U.S. Cl. ..................... 165/80.3; 165/185; 174/16.3; 361/704
(58) Field of Search .................... 165/80.3, 185; 361/704, 710; 174/16.3; 257/722

(56) References Cited

U.S. PATENT DOCUMENTS 3,095,037 * 6/1963 Bohm .................................. 165/185

FOREIGN PATENT DOCUMENTS

1714724-B1 * 2/1992 (SU) ..................................... 257/722

* cited by examiner

*Primary Examiner*—Allen Flanigan
(74) *Attorney, Agent, or Firm*—Fish & Richardson P.C.

(57) ABSTRACT

A heat dissipating device includes a plurality of heat dissipating plates. Each of the heat dissipating plates has a stack plate portion and at least one fin plate portion that extends integrally from the stack plate portion. The stack plate portions of the heat dissipating plates are in close contact with one another and cooperatively form a stack part with a flat contact face adapted to be placed on a heat generating articles. The fin plate portions of the heat dissipating plates are bent from the stack plate portions to extend divergingly away from the stack part. The fin plate portions have confronting surfaces which diverge away from one another.

7 Claims, 15 Drawing Sheets

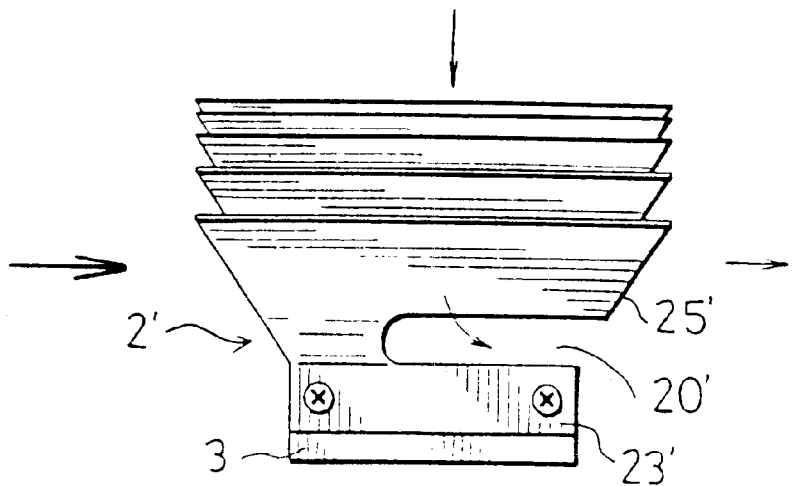
F I G. 10
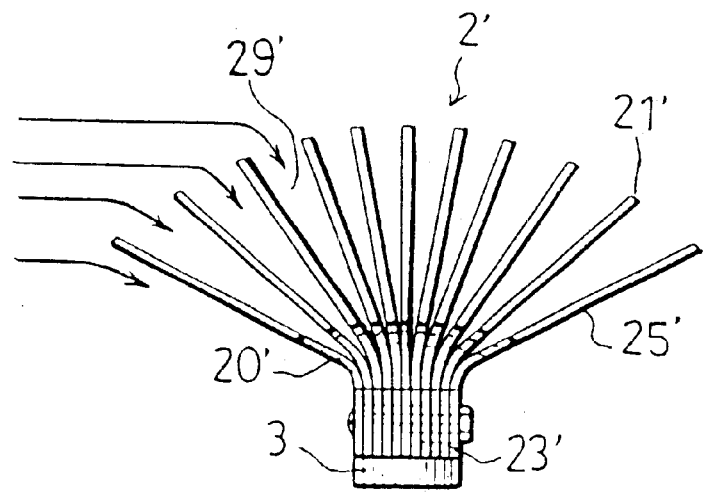
F I G. 11

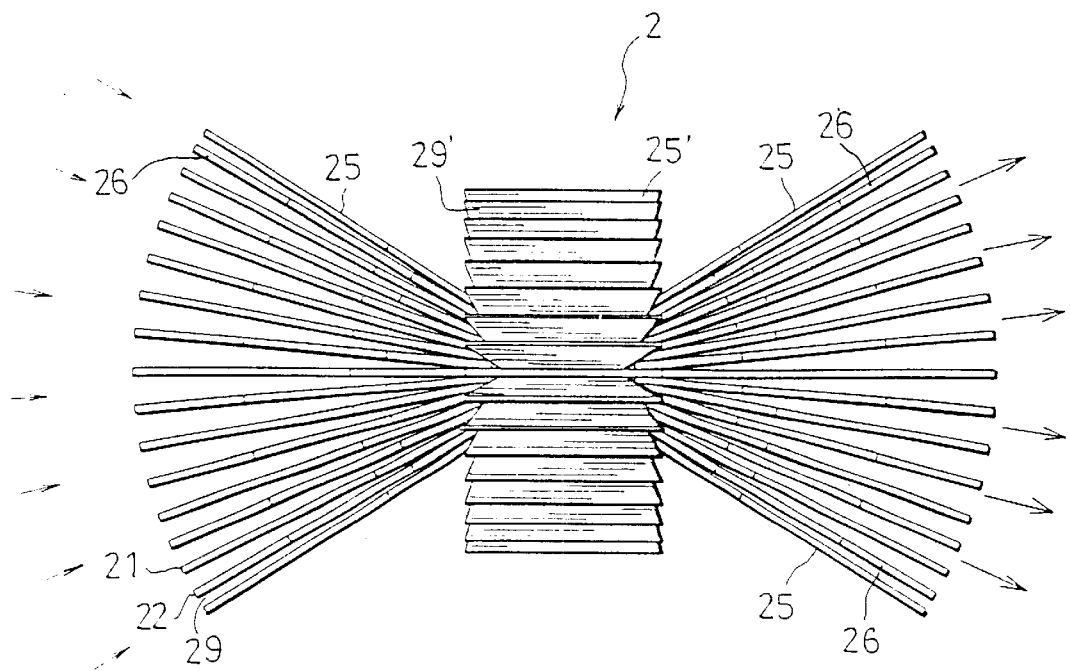
F I G. 15
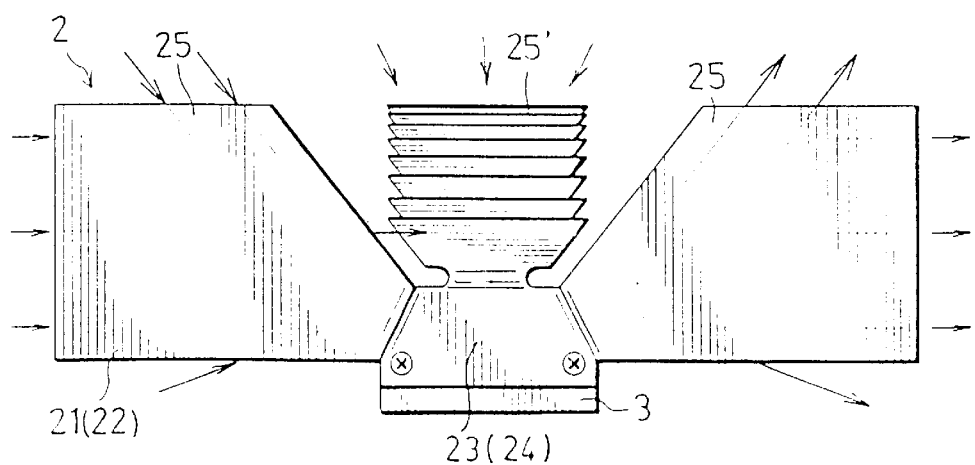
F I G. 16

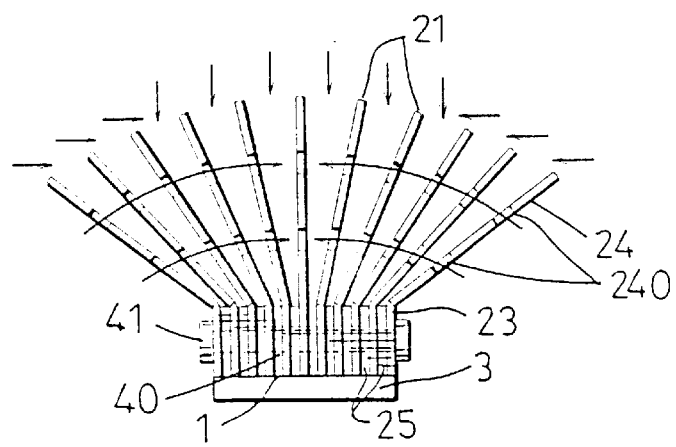
F I G. 19
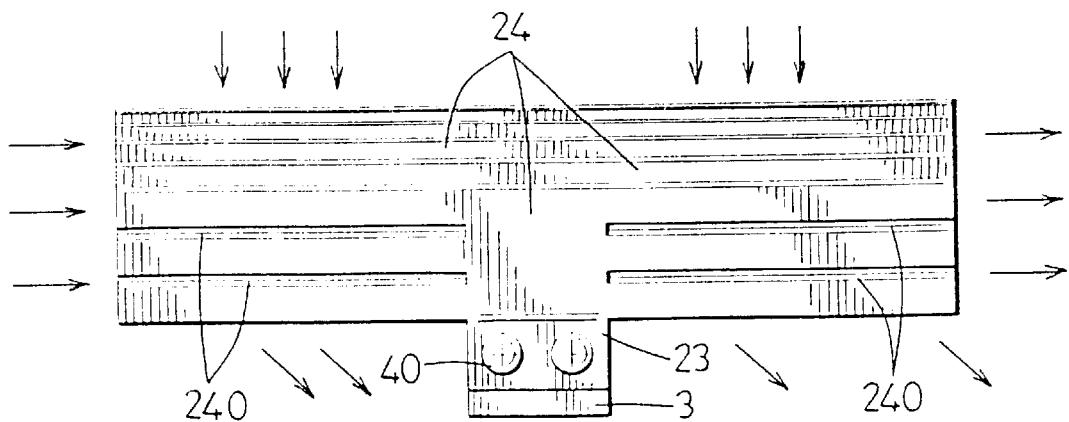
F I G. 20

HEAT DISSIPATING DEVICE

This application is a continuation (and claims the benefit of priority under 35 USC 120) of U.S. application Ser. No. 09/379,069, filed Aug. 23, 1999. The disclosure of the prior application is considered part of (and is incorporated by reference in) the disclosure of this application.

BACKGROUND OF THE INVENTION

1. Field of the Invention

This invention relates to a heat dissipating device more particularly to a heat dissipating device having an enhanced heat dissipating effect.

2. Description of the Related Art

Referring to FIGS. 1 and 2, a conventional heat dissipating device is shown to include a plurality of heat dissipating plates 10 which are disposed side by side. Each of the heat dissipating plates 10 has a stack plate portion 11 and a fin plate portion 12 that extends integrally from the stack plate portion 11 and that has a thickness smaller than that of the stack plate portion 11. The stack plate portions 11 of the heat dissipating plates 10 are in close contact with one another, and cooperatively form a stack part 14 with a flat contact face to be placed in contact with a heat generating article 15. The fin plate portions 12 of the heat dissipating plates cooperatively form a fin part 13. Heat from the heat generating article 15 is essentially dissipated via the fin part 13 of the heat dissipating device. However, since the spacing between the fin plate portions 12 is relatively small, the heat dissipating effect is not satisfactory.

SUMMARY OF THE INVENTION

The object of the present invention is to provide a heat dissipating device that has an enhanced heat dissipating effect.

According to one aspect of the present invention, a heat dissipating device comprises a plurality of heat dissipating plates. Each of the heat dissipating plates has a stack plate portion and at least one fin plate portion that extends integrally from the stack plate portion. The stack plate portions of the heat dissipating plates are in close contact with one another and cooperatively form a stack part with a flat contact face adapted to be placed on a heat generating article. The fin plate portions of the heat dissipating plates are bent from the stack plate portions to extend divergingly away from the stack part. The fin plate portions have confronting surfaces which diverge away from one another.

According to another aspect of the present invention, a heat dissipating device comprises a stack part and a plurality of fin plate portions. The stack part has a contact face adapted to be placed on a heat generating article. The stack part includes a plurality of stack plate portions which are placed in close contact with one another and which extend transversely of the contact face. The fin plate portions extend divergingly from the stack part and have confronting surfaces which diverge away from one another. At least every other one of the stack plate portions are connected to one of the fin plate portions. Each of the fin plate portions is bent from a corresponding one of the stack plate portions.

BRIEF DESCRIPTION OF THE DRAWINGS

Other features and advantages of the present invention will become apparent in the following detailed description of the preferred embodiments of the invention, with reference to the accompanying drawings, in which:

FIG. 10 is a front view of the second preferred embodiment of the heat dissipating device according to the present invention;

FIG. 11 is a side view of the second preferred embodiment of the heat dissipating device according to the present invention;

FIG. 15 is a top view of the fourth preferred embodiment of the heat dissipating device according to the present invention;

FIG. 16 is a front view of a fourth preferred embodiment of the heat dissipating device according to the present invention;

FIG. 19 is a side view of the fifth preferred embodiment of the heat dissipating device according to the present invention;

FIG. 20 is a front view of the fifth preferred embodiment of the heat dissipating device according to the present invention;

DETAILED DESCRIPTION OF THE PREFERRED EMBODIMENTS

Figure 1:
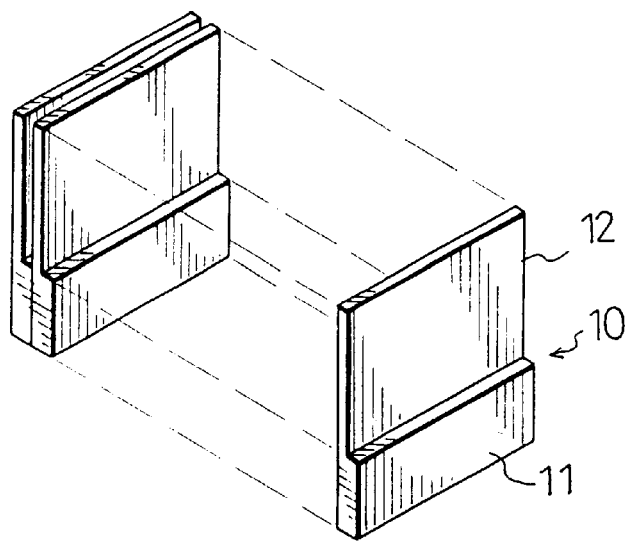
FIG. 1 is an exploded view of a conventional heat dissipating device.
Figure 2:
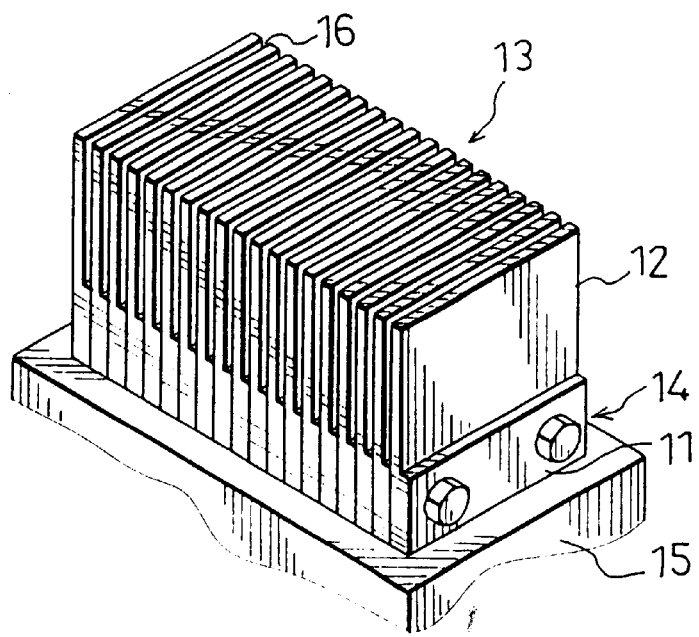
FIG. 2 is a perspective view of the conventional heat dissipating device of FIG. 1 when placed on a heat generating article.

Before the present invention is disclosed in greater detail, it should be noted that like elements are denoted by the same reference numerals throughout the disclosure.

Referring to FIGS. 3, 4, 5 and 6, a first preferred embodiment of a heat dissipating device according to the present invention is shown to comprise a plurality of heat dissipating plates 2 having a plurality of first and second heat dissipating plates 21, 22 that are alternately arranged. Each of the first and second heat dissipating plates 21, 22 has a stack plate portion 23, 24 and a pair of fin plate portions 25, 26 extending from two opposite side edges of the stack plate portions 23, 24 in opposite directions. The stack plate portions 23, 24 are in close contact with and are connected to one another to form stack parts. The fin plate portions 25, 26 of the first and second heat dissipating plates 21, 22 are bent from the stack plate portions 23, 24 to extend divergingly away from the stack parts of the first and second heat dissipating plates 21, 22, respectively. The fin plate portions 25, 26 have confronting surfaces which diverge away from one another.

Figure 3:
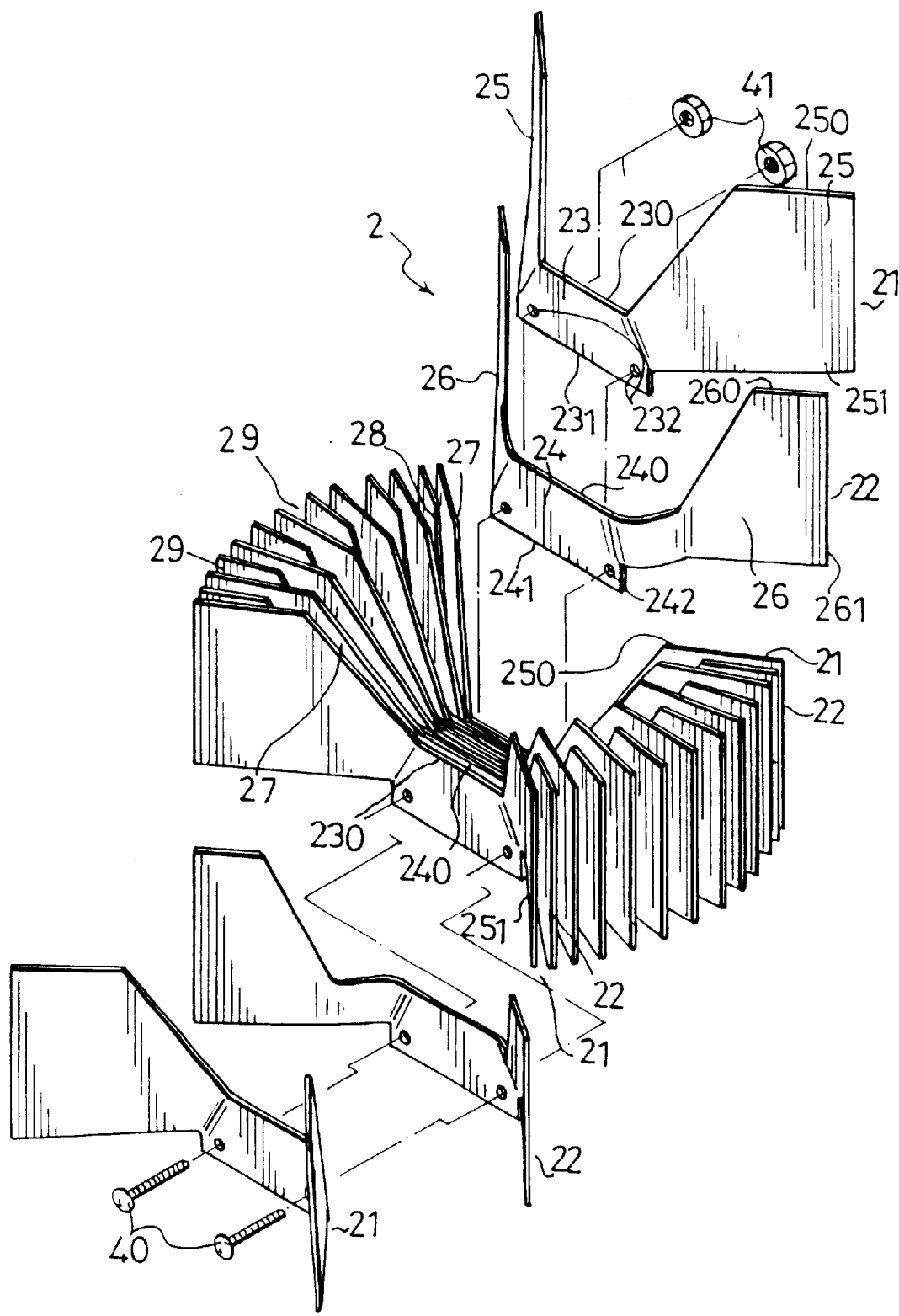
FIG. 3 is an exploded view of a first preferred embodiment of a heat-dissipating device according to the present invention.
Figure 6:
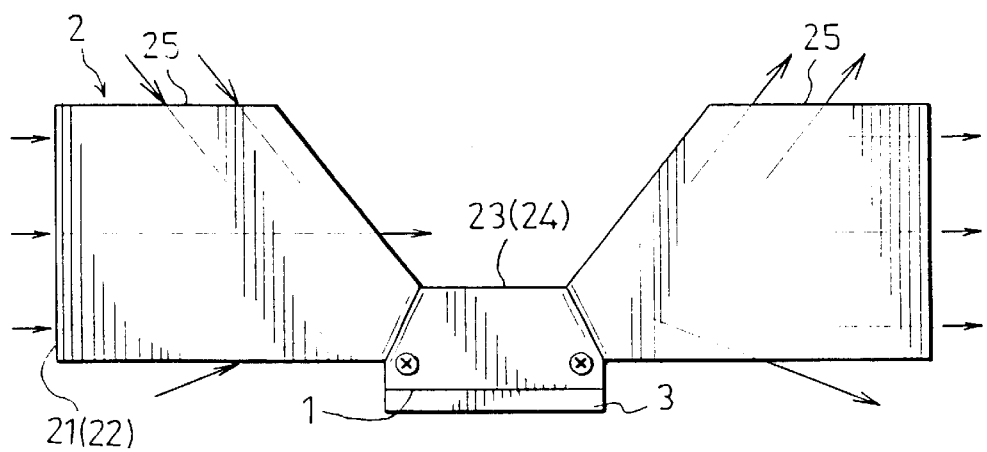
FIG. 6 is a front view of the first preferred embodiment of the heat dissipating device according to the present invention.

Referring to FIGS. 3 and 6, the surface areas of the fin plate portions 25, 26 are greater than those of the stack plate portions 23, 24 of the first and second heat dissipating plates 21, 22. The sizes of the stack plate portions 23, 24 are equal to one another. The size of the fin plate portion 25 of each of the first heat dissipating plates 21 is larger than that of the fin plate portion 26 of each of the second heat dissipating plates 22. However, the sizes of the fin plate portions 25, 26 may be equal to one another.

Figure 4:
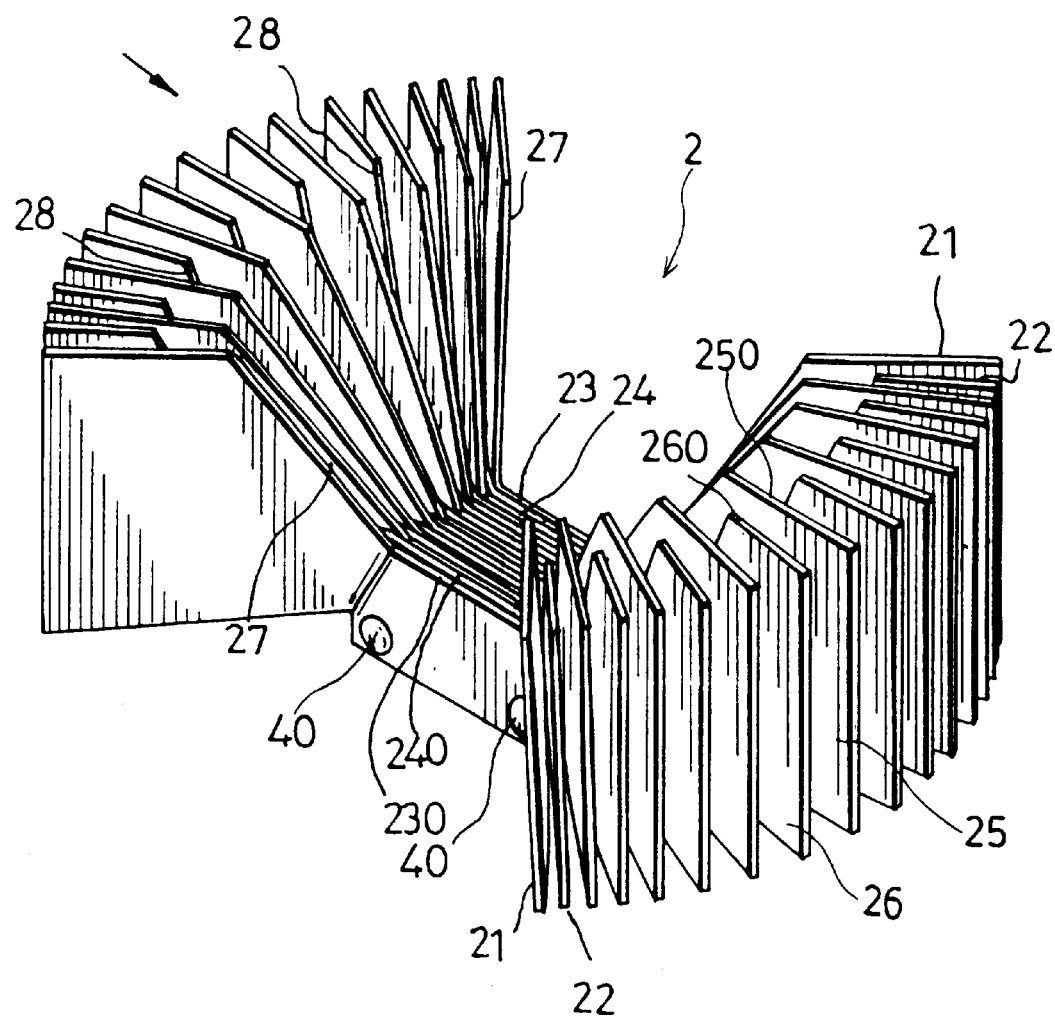
FIG. 4 is a perspective view of the first preferred embodiment of the heat dissipating device according to the present invention.

Referring to FIGS. 4 and 6, top edges 250, 260 of the fin plate portions 25, 26 are higher than top edges 230 240 of the stack plate portions 230, 240. The fin plate portions 25, 26 have inclined edges 27, 28 that extend downwardly from the top edges 250, 260 thereof to the top edges 230, 240 of the stack plate portions 23, 24, respectively. As shown, a plurality of diverging clearances 29 are formed among the fin plate portions 25, 26. As such, an excellent air convection between the fin plate portions 25, 26 can be obtained as compared to the air convection between the close fin plate portions of the aforementioned conventional heat dissipating device, thereby resulting in an enhanced heat dissipating effect of the heat dissipating device according to the present invention. Bottom edges 231, 241 of the stack plate portions 23, 24 are lower than bottom edges 251, 261 of the fin plate portions 25, 26 to form a flat contact face 1 that is adapted to be placed on a heat generating article 3. A air passage is formed below the bottom edges 251, 261 of the fin plate portions 25, 26 to facilitate the air convection of the heat dissipating device.

Referring to FIGS. 3 and 4, each of the stack plate portions 23 of the first heat dissipating plates 21 is formed with two first holes 232. Each of the stack plate portions 24 of the second heat dissipating plates 22 is formed with two second holes 242. The first and second holes 232, 242 are aligned with one another. Two bolts 40 extend respectively through the first and second holes 232, 242 and engage two nut members 41 to fasten the stack plate portions 23, 24 together. However, other fastening or bonding means such as rivets and brazing may be used to bond the stack plate portions 23, 24 together.

Figure 5:
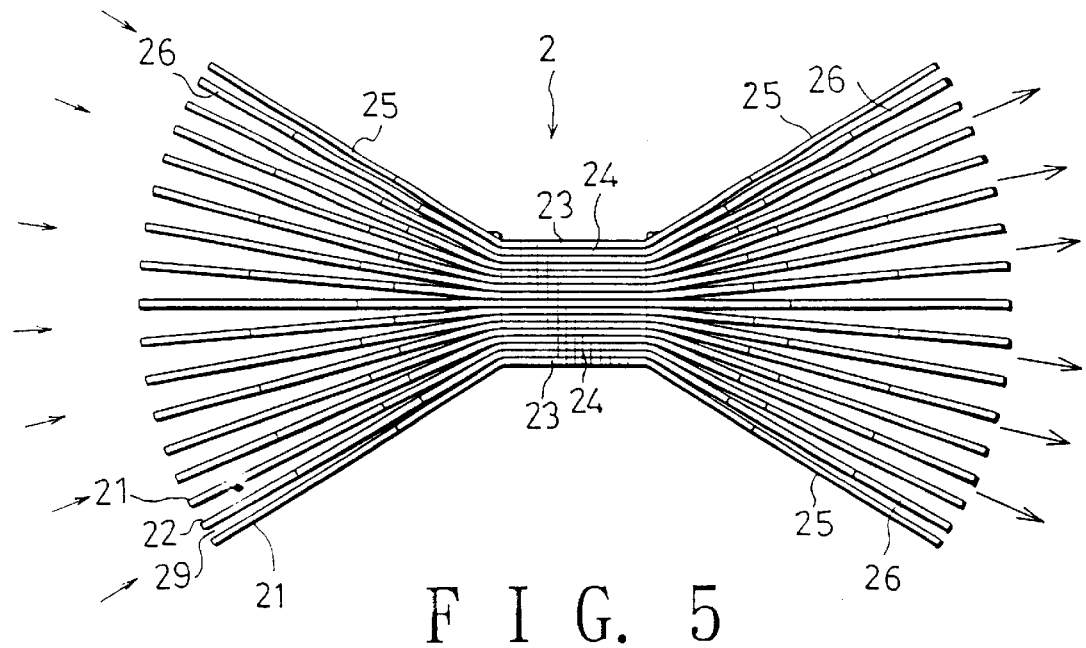
FIG. 5 is a top view of the first preferred embodiment of the heat dissipating device according to the present invention.

In use, with reference to FIGS. 5 and 6, the flat contact face 1 is disposed on the heat generating article 3. The heat from the heat generating article 3 is transferred to the fin plate portions 25, 26 through the stack plate portions 23, 24.

With the above described configuration of the fin plate portions 25, 26, the heat can be dissipated effectively to the atmosphere. It is noted that all of the stack plate portions 23, 24 have the fin plate portions 25, 26 connected thereto. Therefore, the number of the fin plate portions 25, 26 is about twice the number of the fin plate portions 12 of the aforementioned conventional heat dissipating device with the condition that the numbers of the stack plate portions 23, 24 and the stack plate portions 11 equal. Therefore, the effective heat dissipating area of the heat dissipating device can be more than twice that of the conventional heat dissipating device.

Figure 7:
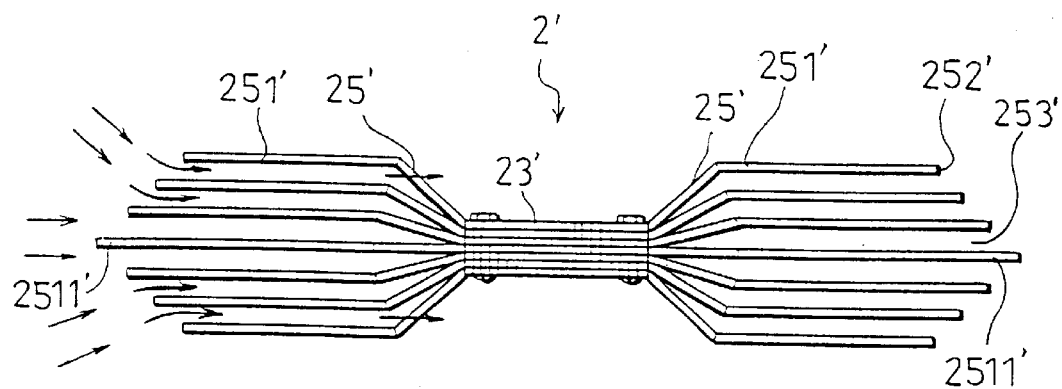
FIG. 7 is a top view of a modification of the first preferred embodiment of the heat dissipating device according to the present invention.
Figure 8:
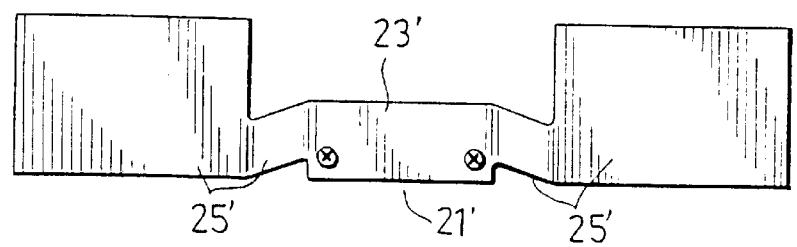
FIG. 8 is a front view of the heat dissipating device shown in FIG. 7.

Referring to FIGS. 7 and 8, a modified heat dissipating device 2' of the first preferred embodiment according to the present invention is shown to a plurality of heat dissipating plates 21'. Each of the heat dissipating plates 21' has a plurality of stack plate portions 23' that are in close contact with one another and that cooperatively form a stack part. Each of the stack plate portions 23' has a fin plate portion 25' extending integrally therefrom and bent divergingly away from the stack part. The fin plate portions 25' of the heat dissipating plates 21' have extension plate portions 251' extending therefrom opposite to the stack part in a parallel relationship. The distal ends 252' of the extension plate portions 251' are staggered with one another with respect to the middle extension plate portion 2511'. As such, air can flow in and out of the clearances formed between the extension plate portions 251' and the fin plate portions 25' in a variety of directions, thereby resulting in an enhanced heat dissipating effect.

Figure 9:
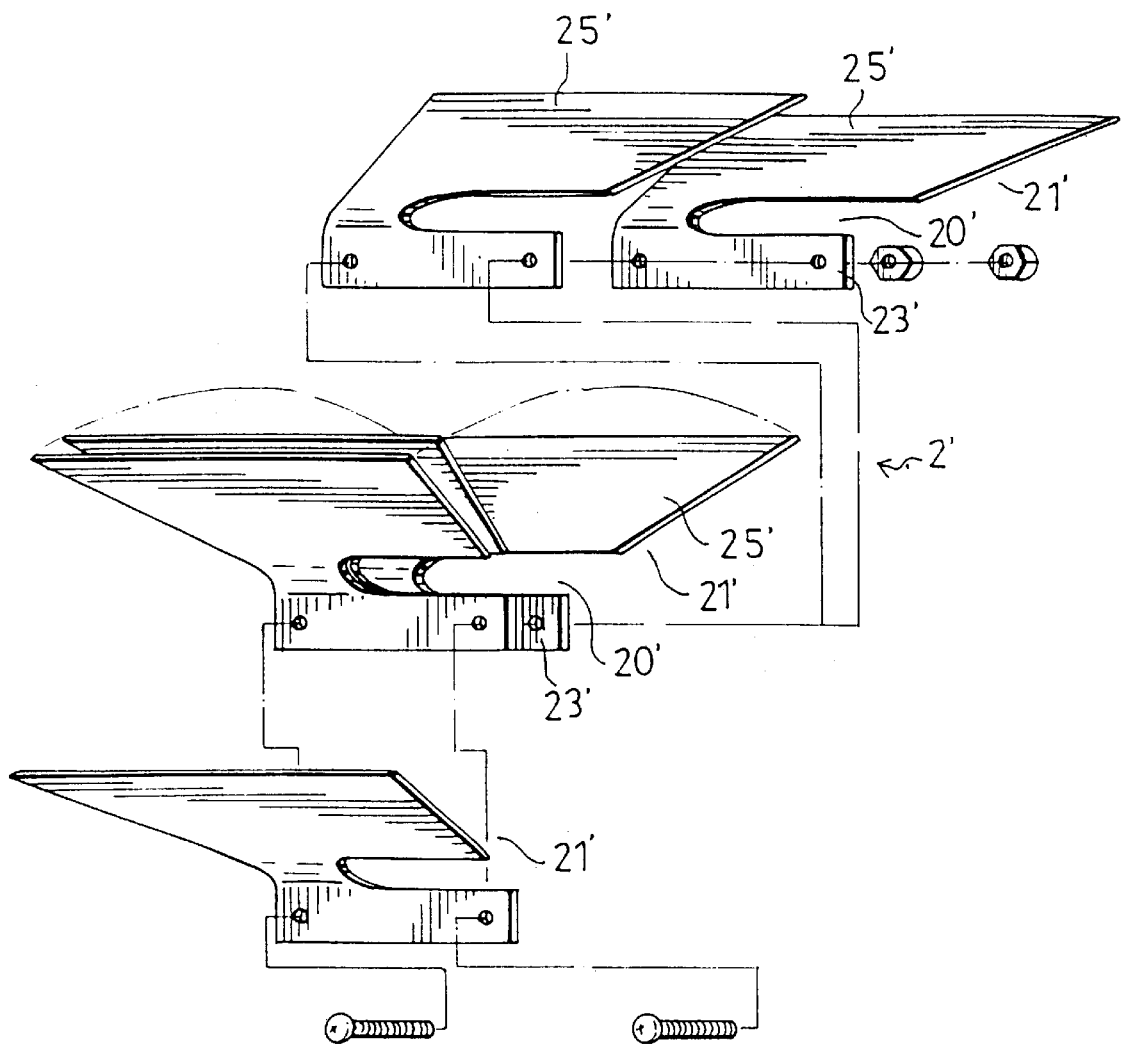
FIG. 9 is an exploded view of a second preferred embodiment of a heat-dissipating device according to the present invention.

Referring to FIGS. 9, 10 and 11, a second preferred embodiment of a heat dissipating device according to the present invention is shown to comprise a plurality of heat dissipating plates 21'. Each of the heat dissipating plates 21' has a stack plate portion 23' and a fin plate portion 25 extending integrally from a top edge of the stack plate portion 23'. The stack plate portions 23' are bonded together closely by bolt-and-nut fastening members to form a stack part. The fin plate portions 25' are bent from the stack plate portions to extend divergingly away from the stack part. The fin plate portions 25' have confronting surfaces which diverge away from one another and which have clearances 29' formed thereamong. In this embodiment, the surface areas of the fin plate portions 25' are much greater than those of the stack plate portions 23' and have ventilation openings 20' adjacent to the stack part. The ventilation openings 20' are aligned with one another to facilitate the air ventilation between the fin plate portions 25'. As a result, the heat from the heat generating article 3 can be dissipated quickly into the atmosphere through the stack plate portions 23' and the fin plate portions 25' to achieve an enhanced heat dissipating effect.

Figure 12:
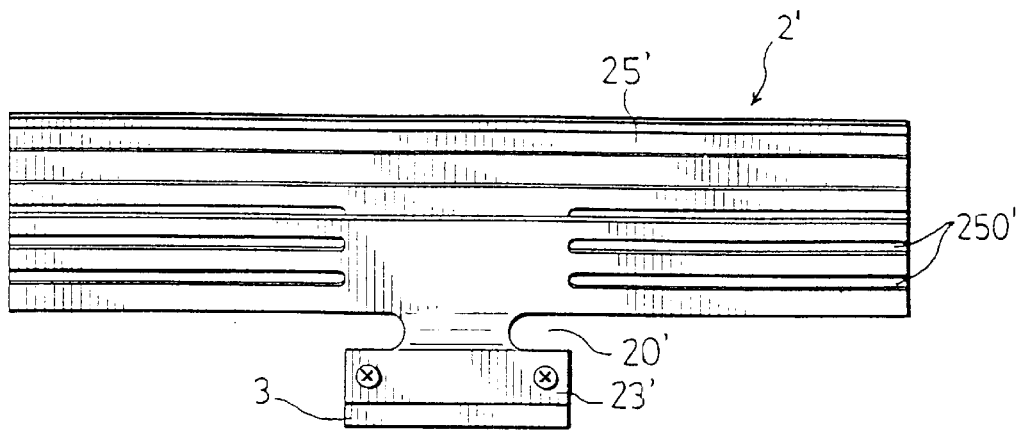
FIG. 12 is a front view of a third preferred embodiment of a heat dissipating device according to the present invention.
Figure 13:
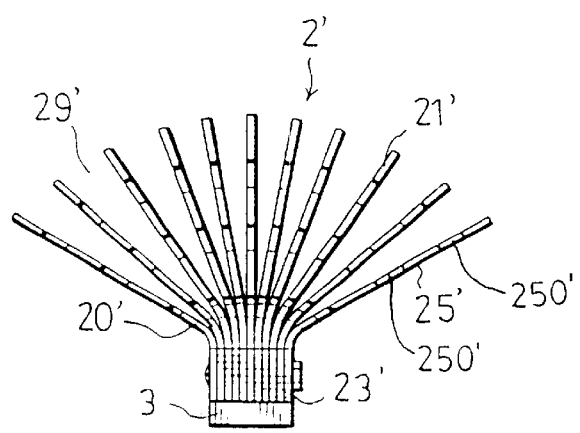
FIG. 13 is a side view of the third preferred embodiment of the heat dissipating device according to the present invention.

FIGS. 12 and 13 illustrate a third preferred embodiment of a heat dissipating device according to the present invention. In this embodiment, the surface areas of the fin plate portions 25' are greater than those of the fin plate portions 25' in the second preferred embodiment in order to increase the heat dissipating effect thereof. In addition, each of the fin plate portions 25' has two elongated ventilation openings 250'. Therefore, the air ventilation effect can be improved when air blows generally perpendicularly to the fin plate portions 25'.

Figure 14:
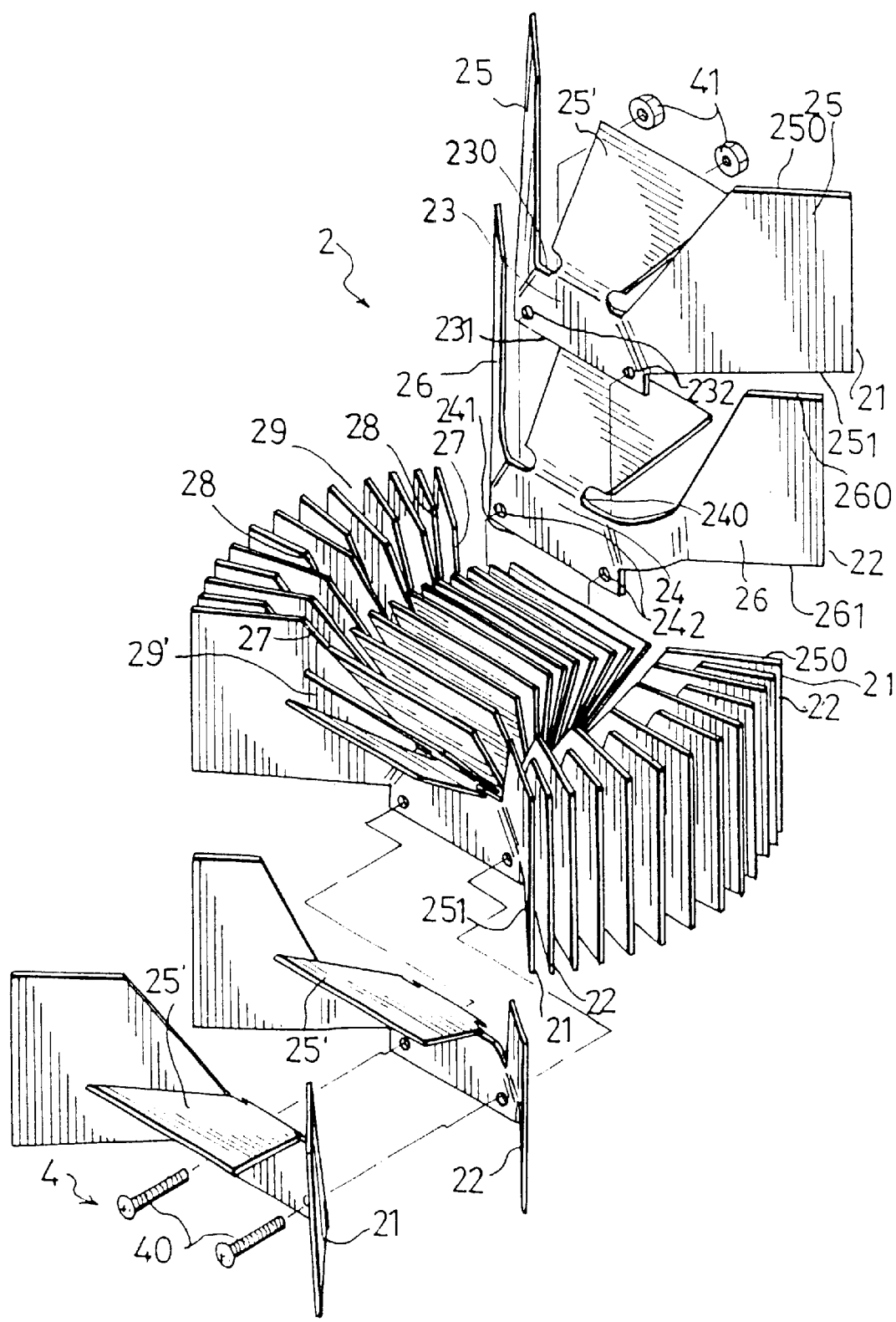
FIG. 14 is an exploded view of a fourth preferred embodiment of a heat dissipating device according the present invention.

Referring to FIGS. 14, 15 and 16, a fourth preferred embodiment of a heat dissipating device according to the present invention is shown to comprise a plurality of first and second heat dissipating plates 21, 22 which are the same as those in the first preferred embodiment. That is, the fin plate portions 25, 26 extend integrally from two opposite sides of the stack plate portions 23, 24, and are bent divergingly away from the stack part. In addition, each of the stack plate portions 23, 24 has a fin plate portion 25' that is the same as the fin plate portion 25' in the second preferred embodiment and that are bent divergingly away from a top edge thereof. As such, a plurality of clearances 29, 29' are formed among the fin plate portions 25, 26 and the fin plate portions 25'. In use, air can flow through the clearances 29, 29' to achieve an excellent heat dissipating effect.

Figure 17:
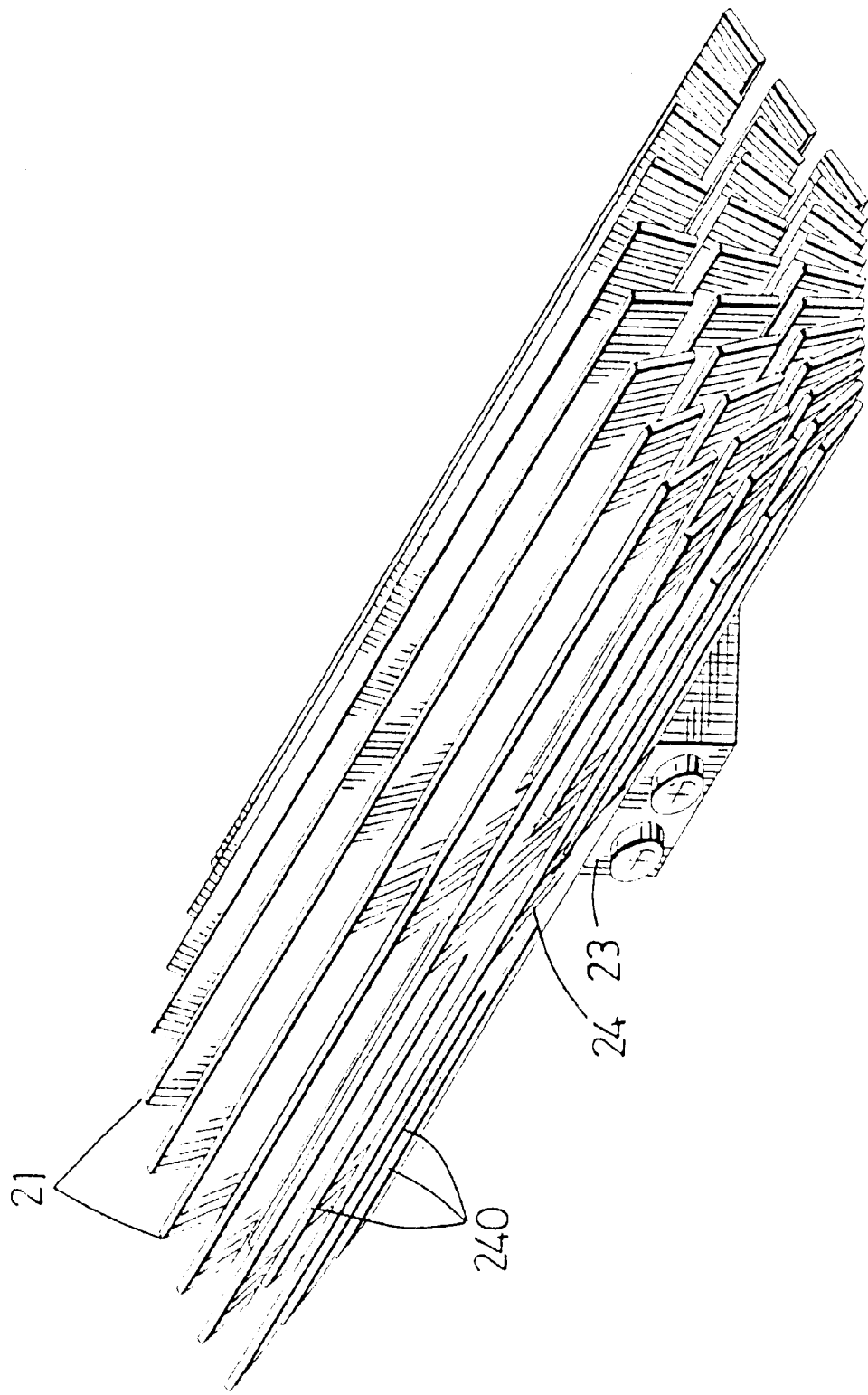
FIG. 17 is a perspective view of a fifth preferred embodiment of a heat dissipating device according to the present invention.
Figure 18:
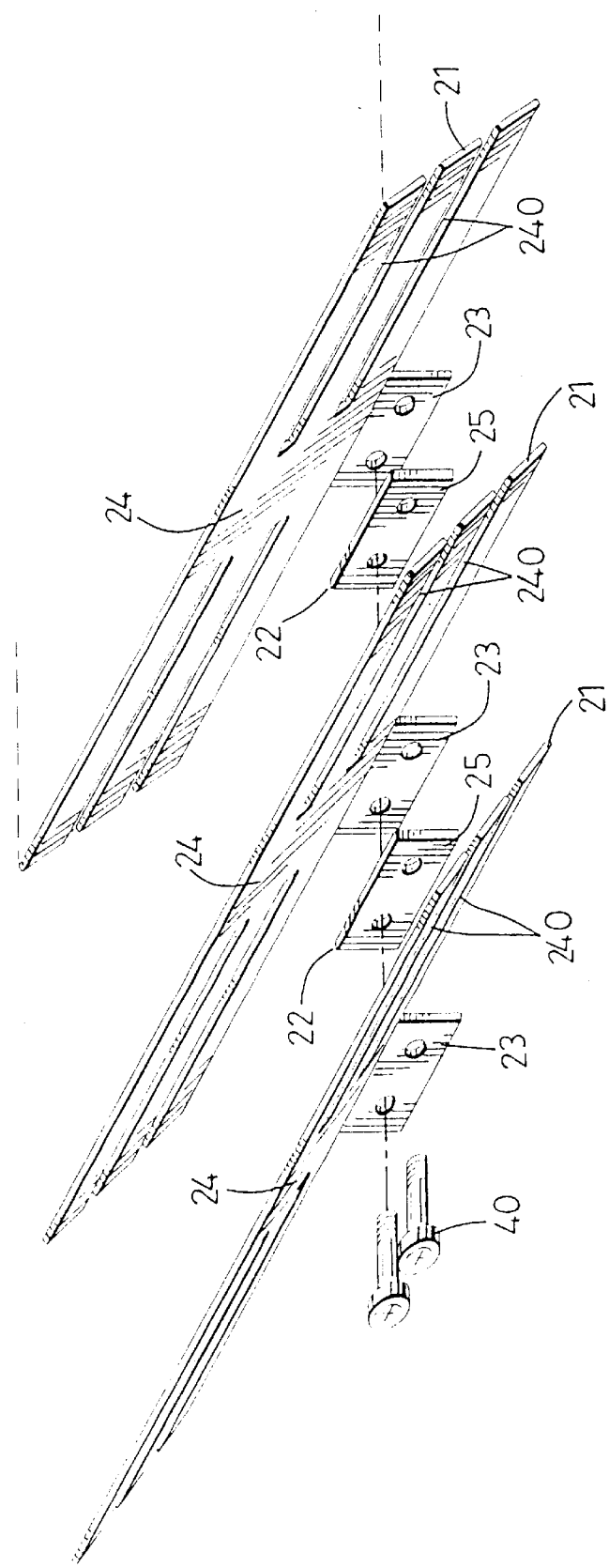
FIG. 18 is an exploded view of the fifth preferred embodiment of the heat dissipating device according to the present invention.

Referring to FIGS. 17, 18 and 19, a fifth preferred embodiment of a heat dissipating device according to the present invention is shown to comprise a plurality of first and second heat dissipating plates 21, 22. In this embodiment, each of the first heat dissipating plates 21 is generally similar to the heat dissipating plate in the third preferred embodiment shown in FIG. 12, and has a stack plate portion 23 and a fin plate portion 24 bent away from an upper edge of the stack plate portion 23. The fin plate portion 24 has a surface area that is greater than that of the stack plate portion 23 of each of the first heat dissipating plates 21, and has a thickness that is the same as that of the latter. A plurality of ventilation openings are formed in the fin plate portions 24.

Referring to FIGS. 19 and 20, each of the second heat dissipating plates 22 has a stack plate portion 25 that has a surface area equal to that of the stack plate portion 23 of each of the first heat dissipating plates 21. The stack plate portions 13 and 25 are in close contact with one another alternately and are bonded together via two bolt members 40 and two nut members 41 to form a stack part with a flat contact face 1 adapted to be placed on a heat generating article 3, as best illustrated in FIG. 19. Each of the first and second heat dissipating plates 21, 22 are made of an extruded aluminum alloy. Each of the fin plate portions 24 has two pairs of ventilation openings 240 on two opposite sides thereof to permit air to flow through the fin plate portions 24, thereby enhancing the heat dissipating effect thereof.

Figure 21:
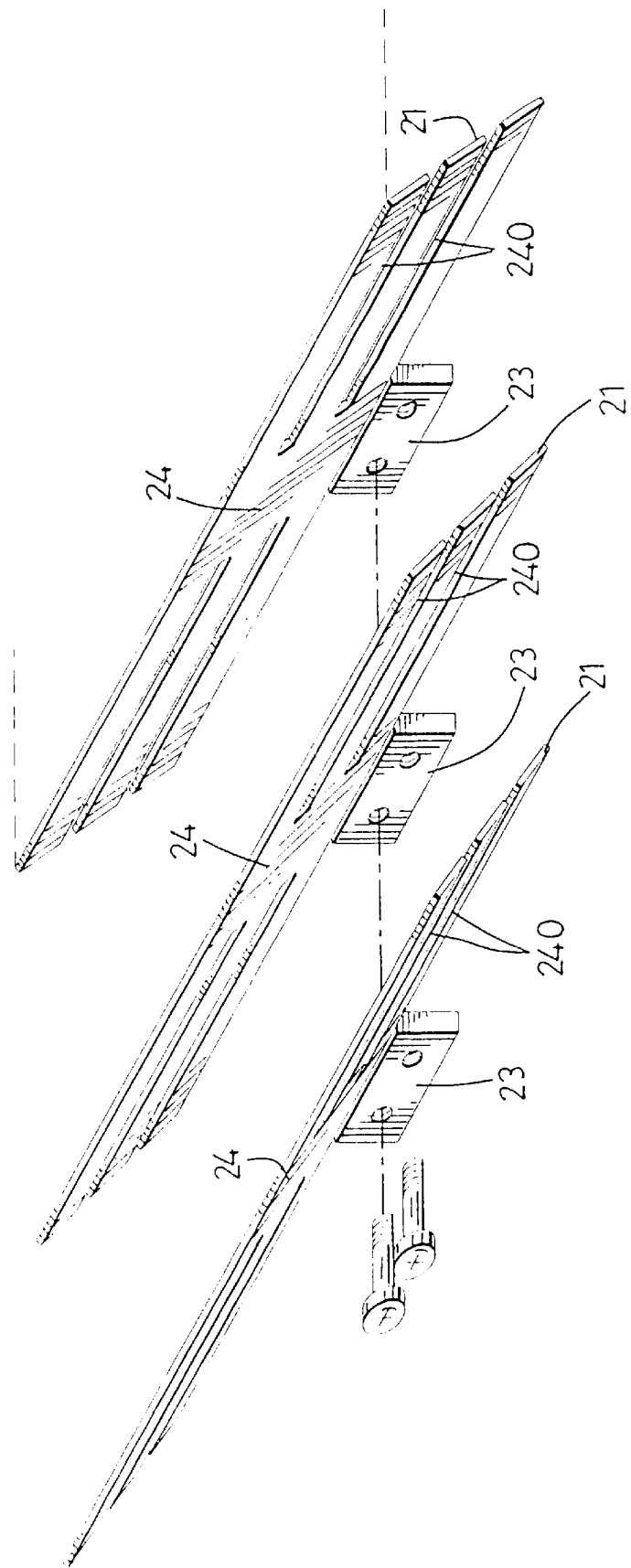
FIG. 21 is an exploded view of a sixth preferred embodiment of a heat dissipating device according to the present invention.
Figure 22:
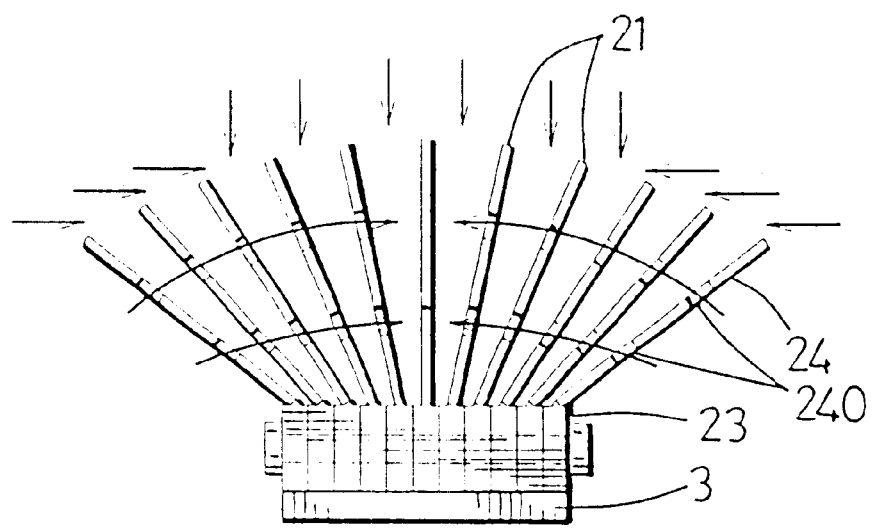
FIG. 22 is a side view of the sixth preferred embodiment of the heat dissipating device according to the present invention.

FIGS. 21 and 22 illustrate a sixth preferred embodiment of a heat dissipating device according to the present invention. In this embodiment, the structure of the heat dissipating device is generally similar to that of the heat dissipating device in the aforementioned fifth preferred embodiment. However, the thickness of each of the stack plate portions 23 is greater than that of each of the fin plate portions 24 of the first heat dissipating plates 21. Therefore, the clearances among the fin plate portions 24 are greater than those of the fin plate portions 24 of the fifth preferred embodiment.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

I claim:

1. A heat dissipating device, comprising:

a plurality of heat dissipating plates having stack plate portions disposed in close contact with one another to form a stack part, each of said plate portions including a bottom edge adapted to contact a heating generating article, a top edge opposite to said bottom edge, and two opposite side edges respectively extending from two opposite ends of said top edge toward said bottom edge, each of said heat dissipating plates further having a pair of fin plate portions respectively connected to and extending in opposite outward directions from said opposite side edges of a corresponding one of said stack plate portions, said fin plate portions being bent from a plane of the corresponding one of said stack plate portions toward the same side of said plane, said fin plate portions of said heat dissipating plates having top ends higher than said top edge and having bottom ends which extend to a level lower than said top edge without converging.

2. The heat dissipating device as claimed in claim 1, wherein said fin plate portions of said heat dissipating plates extend divergingly in opposite outward directions from said opposite side edges of said stack plate portions.

3. The heat dissipating device as claimed in claim 2, wherein said top and bottom edges are parallel, each of said opposite side edges forming an obtuse angle with said top edge.

4. The heat dissipating device as claimed in claim 3, wherein each of said fin plate portions has a surface area greater than that of the corresponding one of said stack plate portion.

5. The heat dissipating device as claimed in claim 4, wherein each of said stack plate portions further includes another fin plate portion which projects upward from said top edge, said another fin plate portions of said stack plate portions extending divergingly away from said top edges of said stack plate portions.

6. The heat dissipating device as claims in claim 1, wherein said fin plate portions are bent further to form parallel extension plate portions opposite to said opposite side edges of said stack plate portions.

7. The heat dissipating device as claimed in claim 6, wherein said extension plate portions have distal ends which are staggered with one another.

* * * * *

(12) INTER PARTES REEXAMINATION CERTIFICATE (537th)
United States Patent
Kuo

(10) Number: US 6,289,975 C1
(45) Certificate Issued: Feb. 22, 2013

(54) HEAT DISSIPATING DEVICE

(76) Inventor: Ching-Sung Kuo, Tu-Cheng (TW)

Reexamination Request:
No. 95/001,072, Jul. 29, 2008

Reexamination Certificate for:
Patent No.: 6,289,975
Issued: Sep. 18, 2001
Appl. No.: 09/804,610
Filed: Mar. 12, 2001

Related U.S. Application Data

(63) Continuation of application No. 09/379,069, filed on Aug. 23, 1999, now abandoned.

(51) Int. Cl.
*H01L 23/367* (2006.01)
*H01L 23/34* (2006.01)
*H05K 7/20* (2006.01)

(52) U.S. Cl. ........ 165/80.3; 165/185; 174/16.3; 257/E23.103; 361/704

(58) Field of Classification Search ................. 165/80.3, 165/185; 174/16.3; 257/E23.103; 361/704, 361/710
See application file for complete search history.

(56) References Cited

To view the complete listing of prior art documents cited during the proceeding for Reexamination Control Number 95/001,072, please refer to the USPTO's public Patent Application Information Retrieval (PAIR) system under the Display References tab.

*Primary Examiner* — Sara Clarke

(57) ABSTRACT

A heat dissipating device includes a plurality of heat dissipating plates. Each of the heat dissipating plates has a stack plate portion and at least one fin plate portion that extends integrally from the stack plate portion. The stack plate portions of the heat dissipating plates are in close contact with one another and cooperatively form a stack part with a flat contact face adapted to be placed on a heat generating articles. The fin plate portions of the heat dissipating plates are bent from the stack plate portions to extend divergingly away from the stack part. The fin plate portions have confronting surfaces which diverge away from one another.

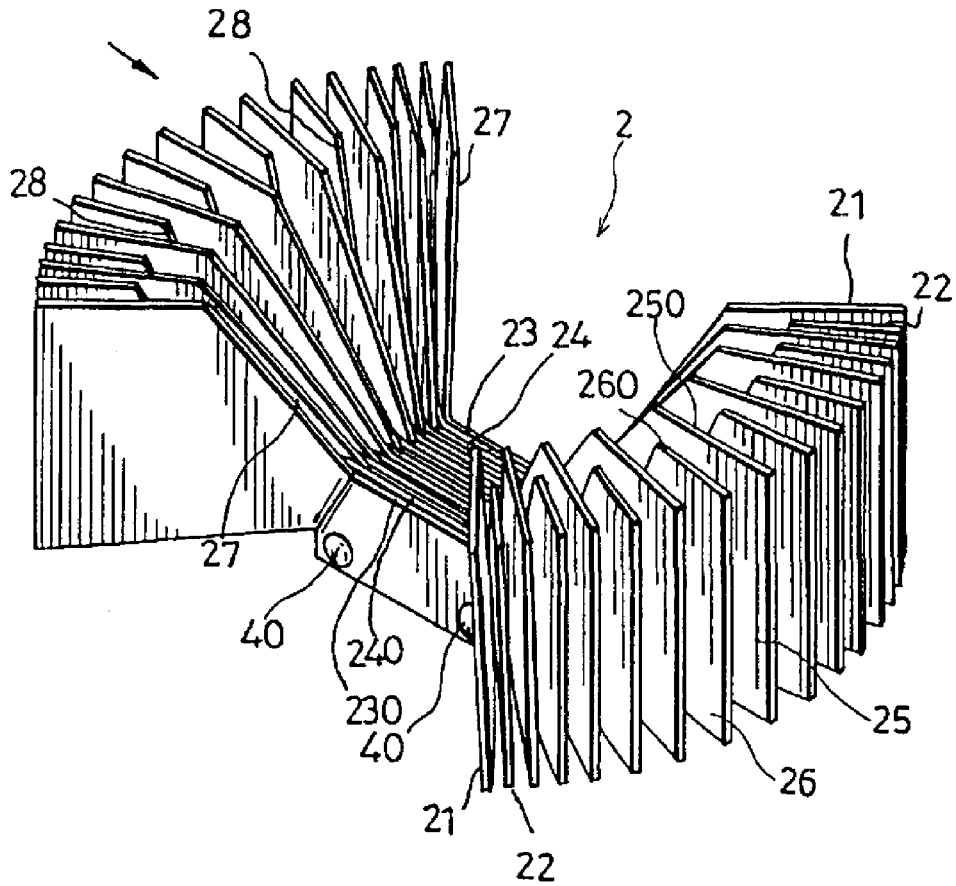

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1 and 2 are cancelled.

Claims 3-7 were not reexamined.

\* \* \* \* \*